(12) United States Patent
Trenz et al.

(10) Patent No.: US 12,244,247 B2
(45) Date of Patent: Mar. 4, 2025

(54) HALF-BRIDGE FOR AN ELECTRIC DRIVE OF AN ELECTRIC VEHICLE OR A HYBRID VEHICLE, POWER MODULE FOR AN INVERTER AND INVERTER

(71) Applicant: ZF Friedrichshafen AG, Friedrichshafen (DE)

(72) Inventors: Ivonne Trenz, Friedrichshafen (DE); Manuel Raimann, Salem (DE); Thomas Bosch, Horgenzell (DE); Ruben Bärenweiler, Markdorf (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 572 days.

(21) Appl. No.: 17/521,614

(22) Filed: Nov. 8, 2021

(65) Prior Publication Data
US 2022/0149752 A1 May 12, 2022

(30) Foreign Application Priority Data
Nov. 9, 2020 (DE) .................... 10 2020 214 045.6

(51) Int. Cl.
*H02M 7/5387* (2007.01)
*H02M 7/00* (2006.01)

(52) U.S. Cl.
CPC ....... *H02M 7/53871* (2013.01); *H02M 7/003* (2013.01)

(58) Field of Classification Search
CPC .............................................. H02M 7/53871
See application file for complete search history.

(56) References Cited

U.S. PATENT DOCUMENTS

| | | | | |
|---|---|---|---|---|
| 6,703,703 B2* | 3/2004 | Grant | .................... | H01L 25/072 257/730 |
| 8,120,153 B1* | 2/2012 | Shen | ................ | H01L 23/49537 257/789 |
| 9,729,059 B1* | 8/2017 | Parto | ..................... | H02M 3/158 |
| 9,806,009 B2* | 10/2017 | Fujino | .............. | H01L 23/49568 |
| 10,141,254 B1* | 11/2018 | Xu | ......... | H02M 7/003 |
| 11,909,327 B2* | 2/2024 | Raimann | ................ | H01L 25/18 |
| 2005/0152101 A1* | 7/2005 | Rodriguez | ......... | H05K 7/20272 361/605 |

(Continued)

FOREIGN PATENT DOCUMENTS

| | | |
|---|---|---|
| DE | 10 2006 050 291 A1 | 5/2007 |
| DE | 10 2006 008 632 A1 | 8/2007 |

(Continued)

*Primary Examiner* — William A Harriston
(74) *Attorney, Agent, or Firm* — Crowell & Moring LLP

(57) ABSTRACT

A half-bridge having semiconductor switch elements embedded in a modular layer system that comprises a contact plane and a metal plating for establishing contact with the semiconductor switch elements, wherein the signal connections and power connections are located on a first surface of the substrate, wherein the modular layer system, signal connections and power connections are cast in a casting compound, wherein external sections of the power connections and/or signal connections formed in the conductor frame each extend from the casting compound, from a second surface that is orthogonal to the first surface, wherein the external sections each have an end that is perpendicular to the first surface.

16 Claims, 4 Drawing Sheets

(56) References Cited

U.S. PATENT DOCUMENTS

| | | | | |
|---|---|---|---|---|
| 2005/0231922 A1* | 10/2005 | Chang | ............... | H01L 24/18 257/E25.011 |
| 2005/0280998 A1* | 12/2005 | Lin | ............... | H05K 7/209 361/704 |
| 2007/0181995 A1* | 8/2007 | Hsu | ............... | H01L 24/24 257/E23.174 |
| 2010/0078204 A1* | 4/2010 | We | ............... | H01L 24/18 29/829 |
| 2012/0087097 A1* | 4/2012 | Hong | ............... | H05K 1/185 361/761 |
| 2013/0009300 A1* | 1/2013 | Yato | ............... | H01L 24/49 257/676 |
| 2014/0035658 A1* | 2/2014 | Usui | ............... | H01L 24/40 327/512 |
| 2014/0265945 A1* | 9/2014 | Deboy | ............... | B60L 58/12 318/139 |
| 2015/0287665 A1* | 10/2015 | Hanada | ............... | H01L 21/565 257/691 |
| 2017/0062386 A1* | 3/2017 | Wang | ............... | H01L 24/19 |
| 2017/0301613 A1* | 10/2017 | Lin | ............... | H01L 23/4952 |
| 2017/0331371 A1* | 11/2017 | Parto | ............... | H02M 3/33561 |
| 2018/0102302 A1* | 4/2018 | Grassmann | ............... | H01L 23/4924 |
| 2018/0145007 A1* | 5/2018 | Hatano | ............... | H01L 25/115 |
| 2019/0304946 A1* | 10/2019 | Cottet | ............... | H01L 23/645 |
| 2019/0335628 A1* | 10/2019 | Lei | ............... | H05K 7/20872 |
| 2020/0066686 A1* | 2/2020 | Mohn | ............... | H01L 25/072 |
| 2020/0153362 A1* | 5/2020 | Xu | ............... | H03K 17/165 |
| 2021/0039491 A1* | 2/2021 | Merz | ............... | F16H 57/04 |
| 2021/0043551 A1* | 2/2021 | Kim | ............... | H01L 23/49551 |
| 2021/0194385 A1* | 6/2021 | Raimann | ............... | H02M 7/53871 |
| 2021/0195808 A1* | 6/2021 | Liu | ............... | H05K 7/20936 |
| 2021/0313296 A1* | 10/2021 | Raimann | ............... | H01L 25/18 |
| 2021/0344276 A1* | 11/2021 | Raimann | ............... | H01L 23/49562 |
| 2022/0109376 A1* | 4/2022 | Raimann | ............... | H02M 7/003 |
| 2023/0112582 A1* | 4/2023 | Kicin | ............... | H01L 23/49568 257/675 |

FOREIGN PATENT DOCUMENTS

| | | |
|---|---|---|
| DE | 10 2015 012 915 A1 | 4/2017 |
| DE | 10 2019 220 010 A1 | 6/2021 |
| DE | 10 2020 205 420 A1 | 11/2021 |

* cited by examiner

HALF-BRIDGE FOR AN ELECTRIC DRIVE OF AN ELECTRIC VEHICLE OR A HYBRID VEHICLE, POWER MODULE FOR AN INVERTER AND INVERTER

CROSS-REFERENCE TO RELATED APPLICATIONS

This claims priority from German Application No. 10 2020 214 045.6, filed on Nov. 9, 2020, the entirety of which is hereby fully incorporated by reference herein.

The invention relates to a power module for an inverter in an electric drive for an electric vehicle or hybrid vehicle and a corresponding inverter.

Purely electric vehicles as well as hybrid vehicles are known in the prior art, which are exclusively or partially driven by one or more electric machines functioning as drive systems. To supply the electric machines in these electric or hybrid vehicles with electricity, the electric and hybrid vehicles comprise electric energy storage units, in particular rechargeable batteries. These batteries form DC voltage sources, while electric machines normally require an AC voltage. For this reason, a power electronics with a so-called inverter is normally interconnected between a battery and an electric machine in an electric or hybrid vehicle.

These inverters normally comprise semiconductor switch elements, typically in the form of transistors. These semiconductor switch elements can be provided with different degrees of integration, specifically either as discreet individual switches with a low degree of integration, but higher scalability, as power modules with a high degree of integration but lower scalability, or as half-bridges, ranging between individual switches and half-bridges with regard to the degree of integration and scalability. Each half-bridge comprises a high side switching position (hereinafter: "high side") with a higher electrical potential, and a low side switching position (hereinafter: "low side") with a lower electrical potential. The high side and low side can each comprise one or more individual switches connected in parallel.

An electronic assembly is disclosed in DE 10 2006 050 291 A1, which comprises a semiconductor power switch and a semiconductor diode. A lower side of the semiconductor power switch comprises an output contact on a chip field on a carrier strip. An upper side of the semiconductor power switch comprises a control contact and an input contact. An anode contact for the semiconductor diode is located on the input contact on the semiconductor power switch and is electrically connected thereto. A cathode contact on the diode is electrically connected to the output contact on the semiconductor power switch.

DE 10 2006 008 632 A1 discloses a power semiconductor component that comprises a flat conductor frame, at least one vertical power semiconductor component, and at least one more electronic component. The vertical power semiconductor component has a first and second side. At least one first contact surface and at least one control contact surface are located on the first side. A least one second contact surface is located on the second side. The at least one other electronic component is located on the second contact surface on the vertical power semiconductor component.

A semiconductor module with at least two semiconductor elements is known from DE 10 2015 012 915 A1, each of which has at least one first electrode on a first side and at least a second electrode on a second side. The first semiconductor element is located above the second semiconductor element. An electrically conductive connection is located between the first semiconductor element and the second semiconductor element. The at least one second electrode on the first semiconductor element is mechanically and electrically connected to the electrically conductive connection. The at least one first electrode on the second semiconductor element is mechanically and electrically connected to the electrically conductive connection.

A power module is known from the not yet published DE 10 2019 220 010.9—the disclosure of which should be included in the present patent application—in which the signal connections and the power connections are all located on the same side of the substrate, and encompassed in a casting compound. The power connections and signal connections can all be accessed from the same side of the substrate, such that the power connections and the signal connections extend from the same side of the substrate through the casting compound, and are located within a base surface spanned by the substrate, seen from the direction they pass through the casting compound.

A power module is known from the not yet published DE 10 2020 205 420.7—the disclosure of which should be included in the present patent application—in which the power connections and signal connections are all formed in a flat conductor frame. Ends of the power connections and signal connections extend laterally from the casting compound and each have a right-angle bend, perpendicular to a surface along which the flat conductor frame extends.

These known power modules have disadvantages in that they are difficult to manufacture. Furthermore, the ampere capacity of the known power modules is limited by the scalability of the semiconductor switch elements, such that these power modules for high power systems, such as 400 V or 800 V systems, is inadequate. Furthermore, the known power modules have a high degree of leakage inductance in the respective commutation cells, which result in high overvoltages that impair the semiconductor switch elements. As a result, the advantages of so-called wide-bandgap semiconductors (semiconductors with wide bandgaps) cannot be used satisfactorily with regard to the short switching times.

The object of the invention is to produce an improved half-bridge for an electric drive in an electric or hybrid vehicle, in which the disadvantages specified above are at least partially overcome.

This object is achieved according to the invention by the method, the half-bridge, the power module, and the inverter according to the independent claims. Advantageous embodiments and developments of the invention can be derived from the dependent claims.

The invention relates to a half-bridge for an electric drive in and electric vehicle or a hybrid vehicle. The half-bridge comprises a substrate, semiconductor switch elements, power connections and signal connections.

The substrate can be, e.g., a DBC (direct bonded copper) substrate, AMB (active metal brazing) substrate, or IM (insulated metal) substrate. The semiconductor switch elements are located on the substrate, in particular transistors and diodes, as well as the associated power connections and signal connections. The substrate is preferably rectangular, in particular in the form of a flat, plate-like rectangle, with two pairs of lateral edges. The substrate can also be square.

The semiconductor switch elements form a high side and a low side in the half-bridge. The high side comprises one or more semiconductor switch elements connected in parallel to one another, to which a comparatively high potential is applied when the half-bridge is in operation. The low side comprises one or more semiconductor switch elements connected in parallel to one another, to which a comparatively low electrical potential is applied when the half-bridge is in operation. The high side and low side are connected in series to one another.

The semiconductor switch elements are preferably high electron mobility transistors (HEMT), in particular gallium nitride (GaN) HEMTs. These types of semiconductor switch elements are comparatively well suited for low-loss and quick switching.

Alternatively, the semiconductor switch elements can be bipolar transistors with an insulated-gate electrode and/or metal-oxide-semiconductor field-effect transistors. Bipolar transistors with an insulated-gate electrode are also known in general as so-called IGBTs. Metal-oxide-semiconductor field-effect transistors are also known in general as so-called MOSFETs.

Each bipolar transistor with an insulated-gate diode preferably has a dedicated freewheeling diode. The freewheeling diodes protect their insulated-gate bipolar transistors from inductive overvoltages, in particular when switching the transistors.

The power connections are electrically connected to power contacts integrated in the semiconductor switch elements, e.g. source electrodes and drain electrodes, or the ground, such that electricity can be transferred from one power connection through a semiconductor switch element to another power connection. Electricity is supplied to the electric motor for driving the electric or hybrid vehicle via the power connections.

The signal connections are used to switch the semiconductor switch elements and are thus electrically connected to the signal contacts for the semiconductor switch elements integrated in the semiconductor switch elements. Depending on the design of the semiconductor switch element, the semiconductor switch element can be switched between a current conducting state and a current blocking state by supplying a current or voltage to the signal contact. Preferably, the semiconductor switch elements are switched in this manner according to a pulse-width modulation (PWM), to enable a sinusoidal temporal curve of the phase currents.

The semiconductor switch elements, power connections, and signal connections in the half-bridges according to the invention are preferably all placed on a first surface of the substrate. Contact can be made to power connections and signal connections there by external components, in particular busbars, in a simple manner. The first surface is preferably one of the two opposing, comparatively largest surfaces of the layered substrate.

According to the invention, the semiconductor switch elements are embedded in a modular layer system. The modular layer system comprises a metal plating and a contact layer to which the metal plating is bonded. The metal plating is in contact with the semiconductor switch elements, in particular for obtaining an electrical connection of the semiconductor switch elements with the power connections and signal connections. The contact layer is populated with the semiconductor switch elements, and is bonded to the underlying substrate, and thus a heatsink.

With the half-bridges according to the invention, the power connections and signal connections are formed on a flat conductor frame, preferably by stamping. This means that the power connections and signal connections are already provided in the flat conductor frame before they are connected to the points on the modular layer system provided for them.

The semiconductor switch elements are first embedded in the layer system before the layer system is cast along with the power connections and signal connections to protect them against environmental effects (alternatively: through transfer molding). This results in a particularly simply production of the half-bridges. In particular, the layout of the metal plating can be adapted to the contacts for the semiconductor switch elements and thus to the arrangement of the power connections and/or signal connections. This simplifies the integration of the semiconductor switch elements, additional gate-driver components and the power and signal connections in the half-bridges, such that the resulting power electronics for the electric drive functions reliably.

The power connections and/or signal connections have external sections that protrude from the casting compound from a second surface that is orthogonal to the first surface. The second surface is a "lateral surface" of the cast, layered substrate, with is normally significantly smaller than the first surface. According to the invention, the external sections each have an end that extends perpendicular to the first surface. This allows for a simple electrical contact to the power connections and signal connections from outside the half-bridges.

The invention also relates to a power module that has at least three half-bridges according to the invention, where each of the half-bridges is preferably assigned to one of at least three phases in an alternating current generated by the power module from a direct current. The invention also relates to an inverter for an electric drive in an electric or hybrid vehicle that contains such a power module. The power module and/or the inverter preferably comprise a heatsink which is also preferably attached to the undersurface of the substrate and can exhibit a cooling structure, such as a pin-fin structure, through which a coolant flows. This also results in the advantages described in relation to the half-bridges according to invention for the power module according to the invention and the inverter according to the invention.

According to one embodiment, the metal plating has a first metal layer facing away from the substrate, and a second metal layer facing toward the substrate, wherein the semiconductor switch elements are located between the first metal layer and the second metal layer, such that the semiconductor switch elements are electrically connected to the first metal layer, and the second metal layer is formed by a metal layer on the substrate facing toward the layer system. The first metal layer and the contact plane are preferably part of a printed circuit board, which preferably also comprises one or more vertical contacts. The substrate in the form of a DCB substrate, for example, comprises two metal layers and an insulating layer located between them. The modular layer system can therefore be obtained with a simple substrate, thus simplifying production of the half-bridge.

According to another embodiment, the metal plating comprises one or more vertical contacts formed between the first metal layer and the second metal layer, which are pre-fabricated in the contact plane before the semiconductor switch elements are embedded in the layer system, in particular the contact plane or printed circuit board. These vertical contacts are used to conduct an electrical current vertically through the layer system from the upper surface of the layer system to a point on the undersurface of the layer system, to obtain electrical contact with an electrode in the semiconductor switch element, in particular a gate, source, or drain electrode. This results in a simple and effective contact with the semiconductor switch element. In particular, the arrangement of the vertical contacts can be adapted to the planned arrangement of the semiconductor switch elements, the power connections, and/or the signal connections.

One or more edge sections of the metal layer preferably extend parallel to the first surface over an edge of the contact plane, or the printed circuit board, wherein at least one of the power connections and/or signal connections is electrically connected to the edge section. This results in a simple electrical connection of the metal plating to at least one of the power connections and/or signal connections.

The first metal layer also preferably has one or more islands on the first surface lying within the contact plane or printed circuit board, wherein at least one of the power connections and/or signal connections and/or at least one gate driver component is electrically connected to the island.

The semiconductor switch elements can be embedded in the modular layer system, in particular the contact plane or printed circuit board, before the printed circuit board is connected to the metal layer on the substrate facing the layer system. Alternatively, the semiconductor switch elements are connected to the metal layer on the substrate facing the layer system, before the printed circuit board is connected to the metal layer on the substrate such that the semiconductor switch elements are embedded in the printed circuit board.

The invention shall be explained below, by way of example, in reference to the embodiments illustrated in the figures.

Therein:

The same objects, functional units and comparable components have the same reference symbols in all of the figures. These objects, functional units and comparable components are identical with respect to their technical features, as long as not otherwise specified explicitly or implicitly in the description.

Figure 1:
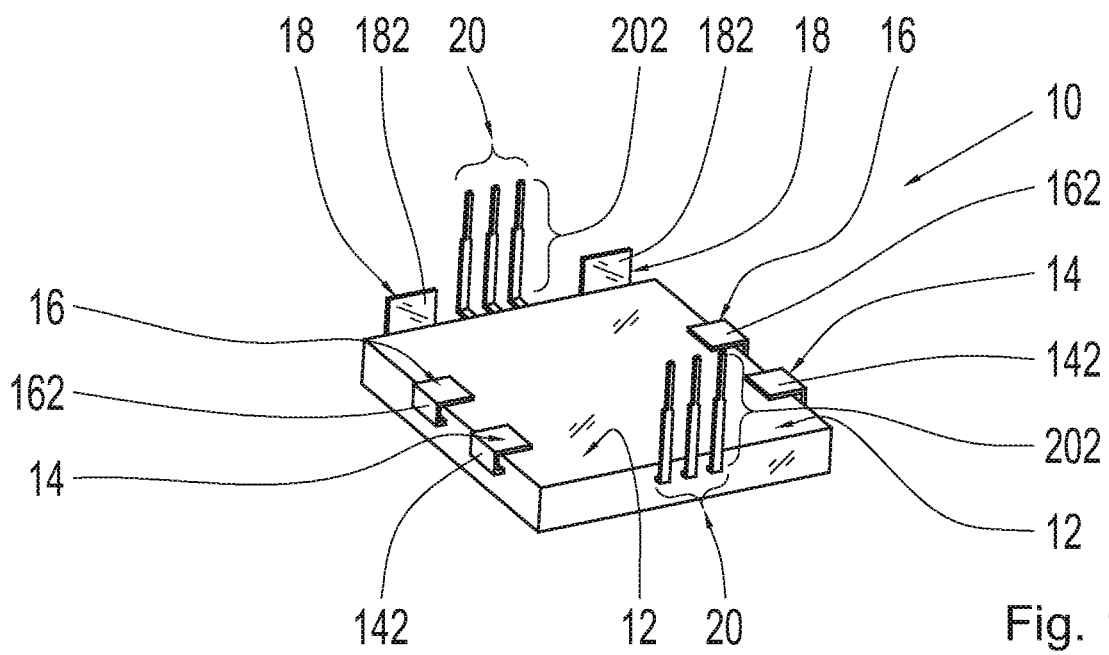
FIG. 1 shows, by way of example and schematically, a half-bridge for an electric drive in an electric vehicle or a hybrid vehicle, according to one embodiment, in a perspective view.

FIG. 1 shows a schematic and exemplary half-bridge 10 for an electric drive in an electric vehicle or hybrid vehicle according to a general embodiment, in a perspective view. The half-bridge 10 comprises numerous semiconductor switch elements 24, which are covered by a casting compound 12 and therefore not visible in FIG. 1. The half-bridge 10 comprises a substrate 26, which is likewise covered by the casting compound 12 and which is populated by the semiconductor switch elements 24. The half-bridge 10 also comprises numerous power connections 14, 16, 18 and numerous signal connections 20. The power connections 14, 16, 18 and signal connections 20 are formed on a flat conductor frame, preferably by stamping. The signal connections 20 are electrically connected to the semiconductor switch elements 24 such that the semiconductor switch elements 24 can be switched via the signal connections 20. The power connections 14, 16, 18 are electrically connected to the semiconductor switch elements 24 such that the semiconductor switch elements 24 allow or interrupt transfer of electricity between the power connections 14, 16, 18.

The signal connections 20 and the power connections 14, 16, 18 are arranged on a first surface of the substrate 26, wherein the first surface is parallel to an upper surface 121 of the casting compound 12. The power connections 14, 16, 18 and the signal connections 20 each have an external connection contact (or external section) 142, 162, 182, 202 formed in the conductor frame, which extends from the casting compound 12 from a second surface that is orthogonal to the first surface. The external connection contacts 142, 162, 182, 202 each have an end that is perpendicular to the first surface. The respective ends are obtained, for example, in that the external connection contacts 142, 162, 182, 202 are bent in a direction perpendicular to the first surface after casting in the casting compound 12. In this manner, the power connections 14, 16, 18 and signal connections 20 can be contacted electrically from outside the half-bridges, in particular from above.

Figure 2:
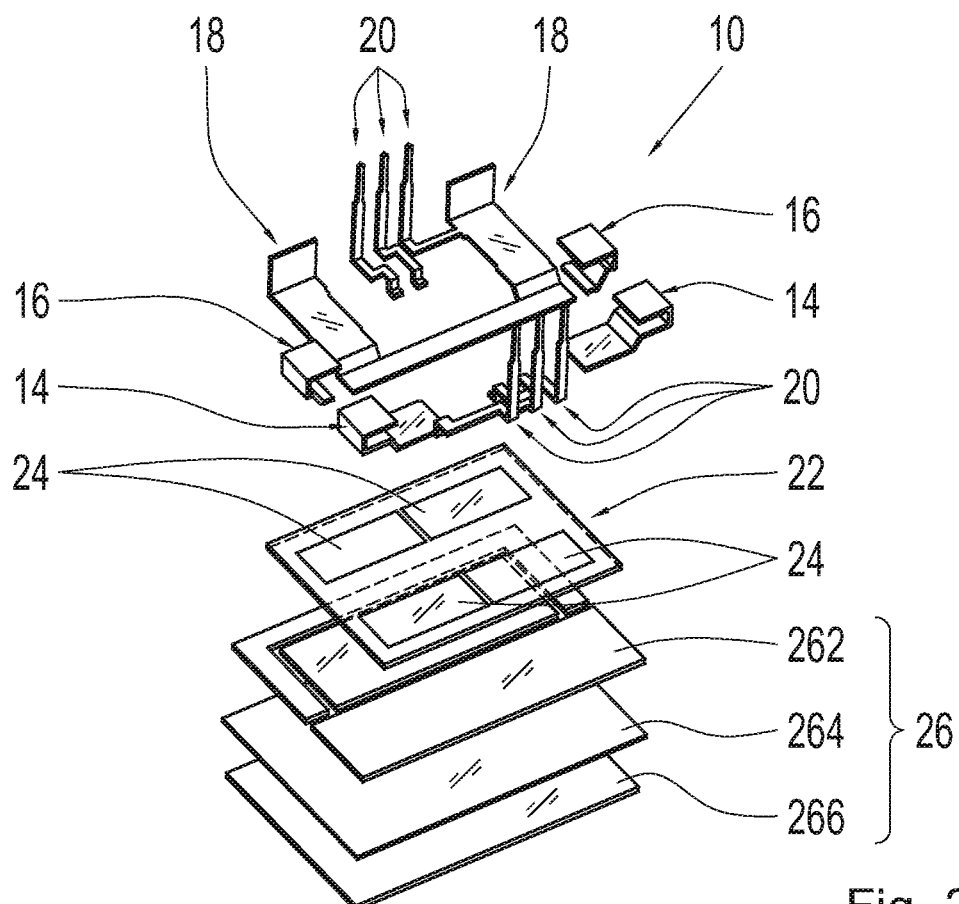
FIG. 2 shows the half-bridge from FIG. 1 in an exploded view.

FIG. 2 shows the half-bridge 10 from FIG. 1 in a schematic, exploded view. This shows the semiconductor switch elements 24 embedded in a modular layer system. The modular layer system comprises a contacting plane 22 in which the semiconductor switch elements 24 are inserted and metal plating for internal contact with the semiconductor switch elements 24. The substrate 26 is a DCB substrate, by way of example, and comprise two metal layers 262, 266 with an insulating layer 264 between them. The power connections 14, 16, 18 and signal connections 20 are also shown. The metal plating preferably comprises three components: a first metal layer on the upper surface of the contact plane 22 facing away from the substrate 26, a second metal layer on the lower side of the contact plane 22 facing toward the substrate 26, and one or more vertical contacts that extend between the first metal layer and the second metal layer. The second metal layer of the metal plating is also formed by the upper metal layer 262 facing the contact plane 22. The contact plane 22 is an insulating plane, for example, which forms a printed circuit board with the first metal layer and the vertical contacts. The first metal layer and the second metal layer as well as the vertical contacts are preferably prefabricated before the semiconductor switch elements 24 are embedded in the layer system. For the embedding, the semiconductor switch elements 24 are first inserted in the contact plane 22, before the contact plane 22 is joined (by soldering) to the upper metal layer on the substrate 26. Alternatively, the semiconductor switch elements 24 can first be placed on the upper metal layer on the substrate 26, before the contact layer 22 is connected to the upper metal layer on the substrate 26. The modular layer system obtained in this manner is then cast along with the power connections 14, 16, 18 and the signal connections 20, after which the power connections 14, 16, 18 and signal connections are placed on the upper surface of the modular layer system. The production process according to the invention for the half-bridges is explained in greater detail in reference to the specific embodiments shown in FIGS. 6 to 11.

Figure 3:
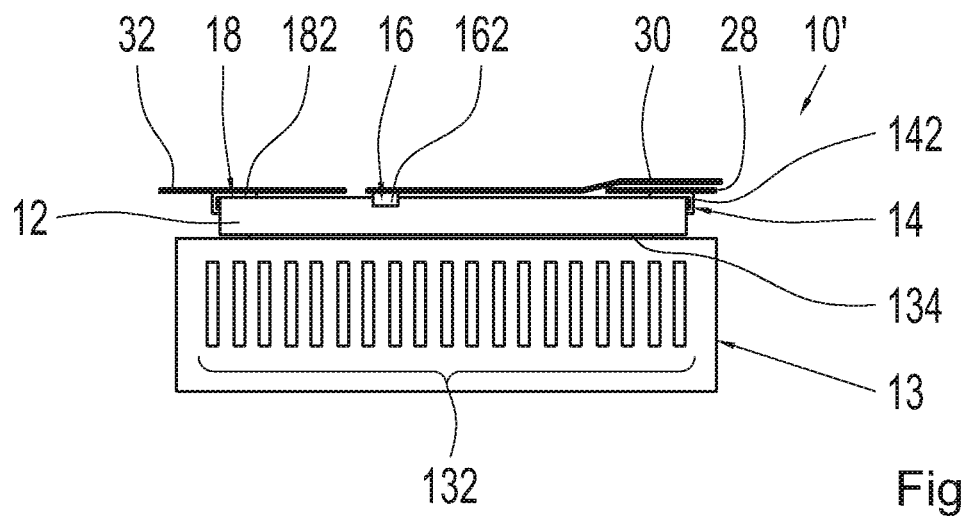
FIG. 3 shows an exemplary and schematic half-bridge according to another embodiment, in a side view, wherein numerous busbars and a heatsink are connected to the half-bridge.

FIG. 3 shows, schematically and by way of example, a half-bridge 10' according to another embodiment, in a side view. The half-bridge 10' is analogous to the half-bridge 10 in FIG. 1, and differs therefrom only in the placement of the power connections on the first surface of the substrate 26. As can be seen in FIG. 3, the casting compound 12 is connected at the bottom to a heatsink 13 by sintering, for heat dissipation from the semiconductor switch elements 24 and other electronic components in the half-bridge 10'. There is a pin-fin structure 132 containing numerous pins in the heatsink, for example, between which cooling channels are formed, through which a coolant (water-glycol) flows. Numerous busbars are attached to the upper surface of the casting compound 12. A first busbar 28 is electrically connected to the external contact 142 for the first power connection 14 (preferably a negative DC connection). A second busbar 30 is electrically connected to the external connection contact 162 for the second power connection 16 (preferably a positive DC connection). A third busbar 32 is electrically connected to the external connection contact 182 for the third power connection 18 (preferably an AC connection or phase connection). An insulating layer is also preferably located between the first busbar 28 and second busbar 30, to ensure the difference in electrical potentials between the two busbars 28, 30. In this manner, the two busbars 28, 30 can be safely placed next to one another, such that the air gap and leakage gap are maintained, and the leakage inductance and commutation cell in the half-bridge 10' are reduced.

The first busbar 28 is connected to a positive pole in the power source (e.g. a lithium battery or fuel cell system) and the second busbar 30 is connected to a negative pole in the power source. The third busbar 32 is preferably connected via a busbar system to the electric drive, in particular an electric machine, in order to output the AC power to the coils in the electric machine.

Figure 4:
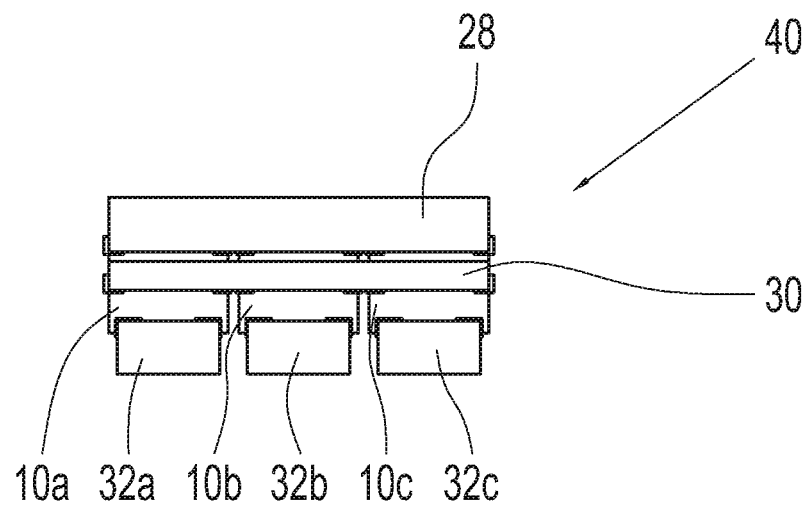
FIG. 4 shows an exemplary and schematic power module, comprising three half-bridges according to the invention.

FIG. 4 shows, schematically and by way of example, a power module 40 for an inverter, which comprises three half-bridges 10a, 10b, 10c according to the invention. Each half-bridge 10a, 10b, 10c is assigned one of three phases in the multi-phase output current (alternating current). To electrically connect all three of the first power connections 14 in the three half-bridges 10a-c, the busbar 28 is connected to these three power connections 14. To electrically connect all of the second power connections 16 in the three half-bridges 10a-c, the second busbar 28 is connected to all three of these second power connections 16. Each half-bridge 10a-c is assigned its own third busbar 32, which is electrically connected to the third (AC) power connections 18 in the respective half-bridges 10a-c.

Figure 5:
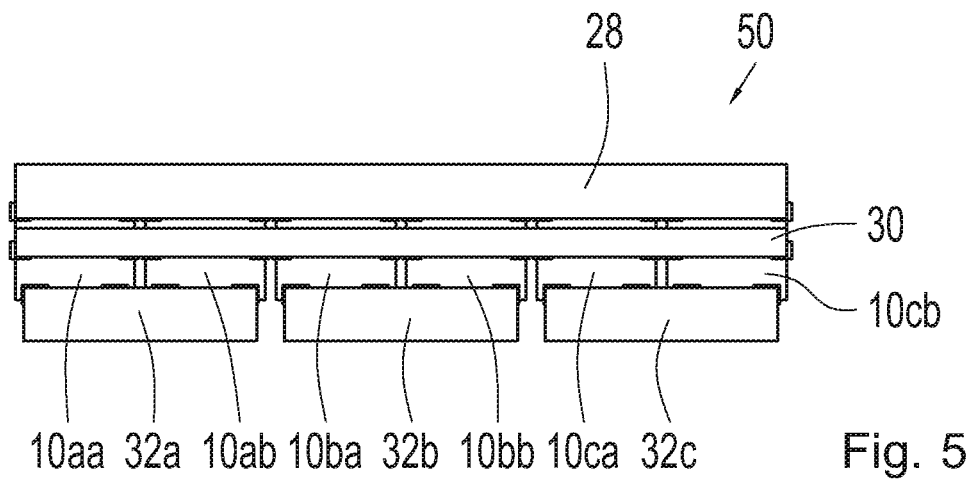
FIG. 5 shows an exemplary and schematic power module, comprising six half-bridges according to the invention.

FIG. 5 shows, schematically and by way of example, another power module 50 for an inverter, which comprises six half-bridges 10aa, 10ab, 10ba, 10bb, 10ca, 10cb according to the invention. The six half-bridges 10aa, 10ab, 10ba, 10bb, 10ca, 10cb, are divided into three groups, each containing two half-bridges 10aa and 10ab, 10ba and 10bb, and 10ca and 10cb. A first group of half-bridges 10ba 10bb is assigned to a first phase. A second group of half-bridges 10ba, 10bb is assigned to a second phase. A third group of half-bridges 10ca, 10cb is assigned to a third phase. The busbars 28, 30 32a-c are arranged in the power module 50 in a manner analogous to the embodiment in FIG. 4.

FIGS. 6-8 and FIGS. 9-11 each show a specific embodiment of the half-bridges 10, 10' according to the invention. For purposes of the illustration, the casting compound is not shown in these embodiments.

Figure 6:
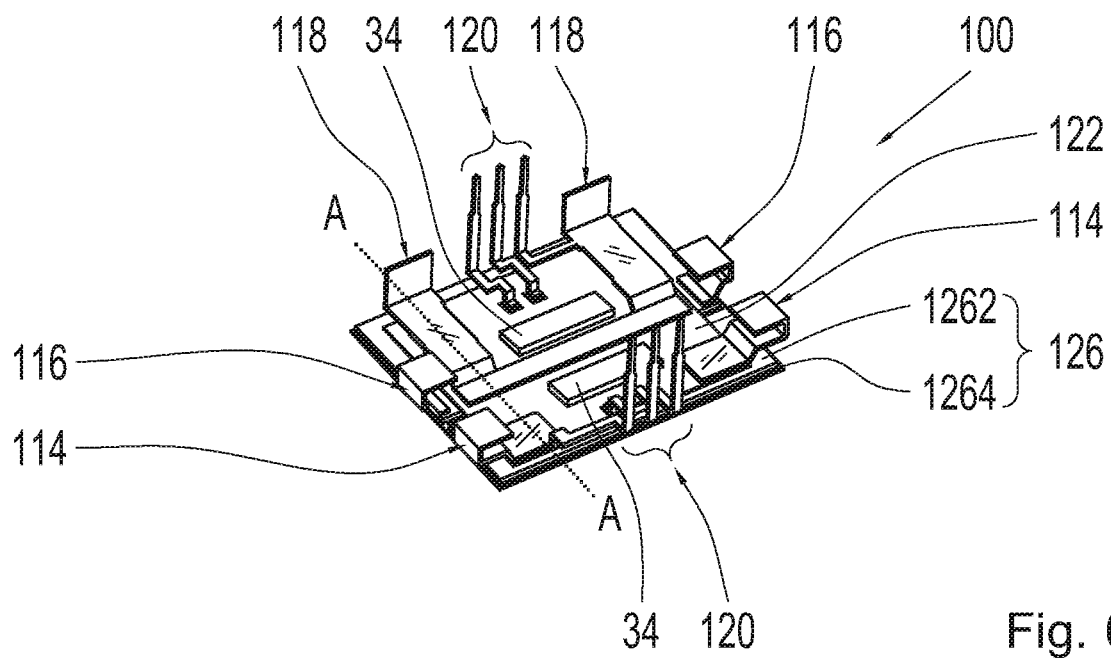
FIG. 6 shows an exemplary and schematic half-bridge according to another embodiment, wherein the casting compound is not shown, for the purpose of the illustration.
Figure 7:
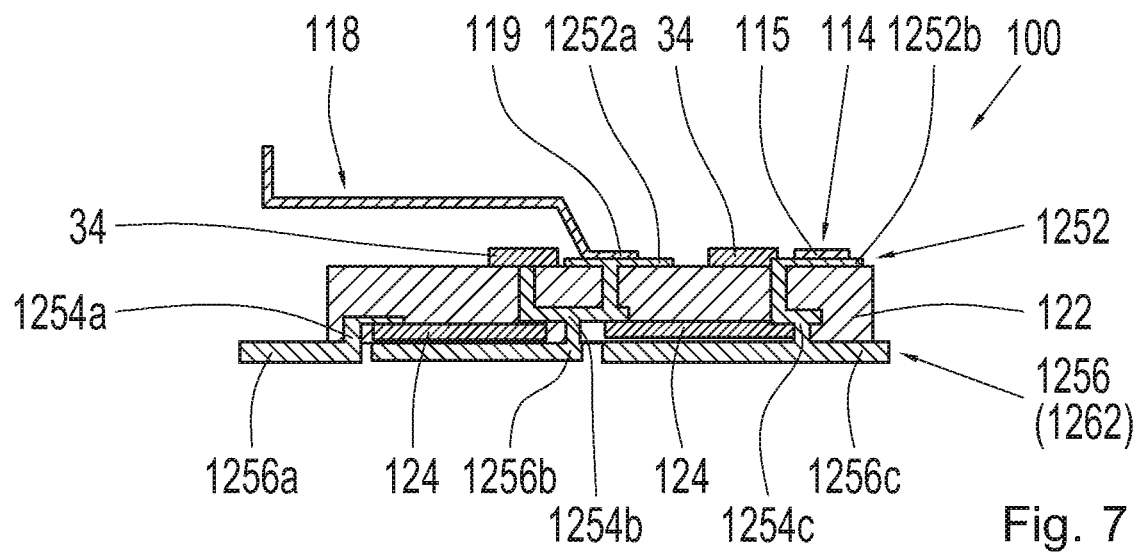
FIG. 7 shows the half-bridge from FIG. 6 in a side view.
Figure 8:
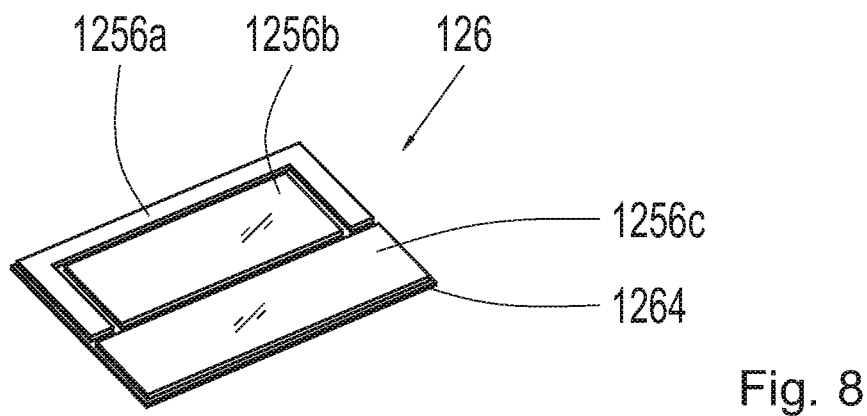
FIG. 8 shows the substrate from the half-bridge in FIG. 6 in a perspective view.

FIGS. 6-8 show a first specific embodiment of the half-bridge 100. Analogous to the general embodiment in FIGS. 1 and 2, the half-bridge 100 comprises, a substrate 126, numerous power connections 114, 116, 118, and numerous signal connections 120. The substrate 126 is a DCB substrate in this case, which has a first metal layer 1262, which faces the semiconductor switch elements 124, a second metal layer, which faces away from the semiconductor switch elements 124, and is connected to a heatsink (not shown), and an insulating layer 1264, which is located between the first metal layer 1262 and the second metal layer. The semiconductor switch elements 124 are embedded in a modular layer system comprising a contact plane 122 and a metal plating. The contact plane 122 is on the upper surface of the substrate 126. The metal plating comprises a first metal layer 1252 that faces away from the substrate 126, a second metal layer 1256 that faces toward the substrate 126, and numerous vertical contacts 1254a-c that extend vertically between the first metal layer 1252 and the second metal layer 1256, as shown in greater detail in the cutaway view in FIG. 7, along the cutting line A-A in FIG. 6. The second metal layer 1256 is formed from the first metal layer 1256. As the perspective view in FIG. 8 shows, the first metal layer 1262 has three pre-structured regions, through which the second metal layer 1256 is formed. These different regions are spatially separated from one another, in order to ensure that they are electrically insulated from one another. The contact plane 122 along with the first metal layer 1252 and the vertical contacts 1254a-c form a printed circuit board here. The vertical contacts 1254a-c are first prefabricated inside the contact plane, or printed circuit board, before the semiconductor switch elements 124 are embedded in the contact plane 122, or printed circuit board. The embedding of the semiconductor switch elements 124 can take place in two ways. In the first way, the semiconductor switch elements 124 can be inserted from below (specifically the side facing the substrate 126) in places in the contact plane 122, or printed circuit board, intended for this, preferably holes, before the contact plane 122, or printed circuit board, is placed on the first metal layer 1252 on the pre-structured substrate 126. In the second way, the semiconductor switch elements 125 can be position on the first metal layer 1252 of the pre-structured substrate 126, before the contact plane 122, or printed circuit board, is placed on the first metal layer 1252 of the substrate 126, such that the semiconductor switch elements 124 are placed in places in the printed circuit board 124 intended for this, preferably holes. The first metal layer 1252 of the metal plating can already be formed on the upper surface of the contact plane 122 before the contact plane 122 is placed on the substrate 126.

As is shown in greater detail in the cutaway view in FIG. 7, the first metal layers 1252a-b comprise two islands 1252a, 1252b, which are within the contact plane 122 in relation to the first surface (parallel to the upper surface 121 of the casting compound 12 in FIG. 1). The third power connection 118 is electrically connected to the first island 1252a via a (third) internal connection contact 119. The first power connection 114 is electrically connected to the second island 1252b via a (first) internal connection contact 115.

In addition, the first island 1252a is electrically connected to a second vertical contact 1254b, which extends from the middle 1256b of the second metal layer 1256 to the first metal layer 1252. The middle 1256b is in direct electrical and thermal contact with a first semiconductor switch element 124. The second vertical contact 1254b has a vertical section in the contact plane 122, which transitions into two branches via a horizontal section, wherein the first island 1252a is electrically connected to one of these two branches. A first driver component 34 for operating a gate electrode in the first semiconductor switch element 124 is place on the upper surface of the contact plane 122, such that it is electrically connected to the other branch of the second vertical contact 1254b. An electrical connection is obtained in this manner between the center 1256b of the second metal layer 1256 and the third power connection 118, as well as the first driver component 34.

The second island 1252b is electrically connected to a third vertical contact 1254c that extends from a second edge 1256c of the second metal layer 1256 to the first metal layer 1252. The second edge 1256c is in direct electrical and thermal contact with a second semiconductor switch element 124. The third vertical contact 1254c has a vertical section in the contact plane 122, which transitions into another vertical section via a horizontal section. There is also a second driver component 34 next to the first power connection 114 for driving a gate electrode in the second semiconductor switch element 124, which is electrically connected to the third vertical contact 1254c via the second island 1252b. An electrical connection between the first edge 1256c of the second metal layer 1256 and the first power connection 114, as well as the second driver component 34, is obtained in this way.

The second metal layer 1256 also has a first edge 1256a, which extends horizontally over the contour of the contact plane 122, like the second edge 1256c. The first edge 1256a is electrically connected to the first vertical contact 1254a, which extends vertically from the first edge 1256a into the interior of printed circuit board 122, and transitions into a horizontal section that is located at the same height as the horizontal sections of the second and third vertical contacts 1254b-c. The first semiconductor switch element 124 is embedded in the contact plane 122 between the horizontal sections of the first and second vertical contacts 1254a-b and the middle 1256b of the second metal layer 1256. The second semiconductor switch element 125 is embedded in the contact plane 122 between the horizontal section of the second vertical contact 1254b and the second edge 125c of the second metal layer 1256.

As is shown schematically in the perspective view in FIG. 6, the first power connections 114 are each electrically connected to a second island in the first metal layer 1252. The second power connections 116 are electrically connected to the first edge 1256a of the second metal layer 1256. The third power connections 118 are electrically connected to the first island in the first meal layer 1252 via the internal connection contact 119, which extends horizontally between the two driver components 34. The signal connections 120 are each electrically connected to another island in the first metal layer 1252 via an internal connection contact. The islands in the first metal layer 1252 are electrically insulated from one another.

Figure 9:
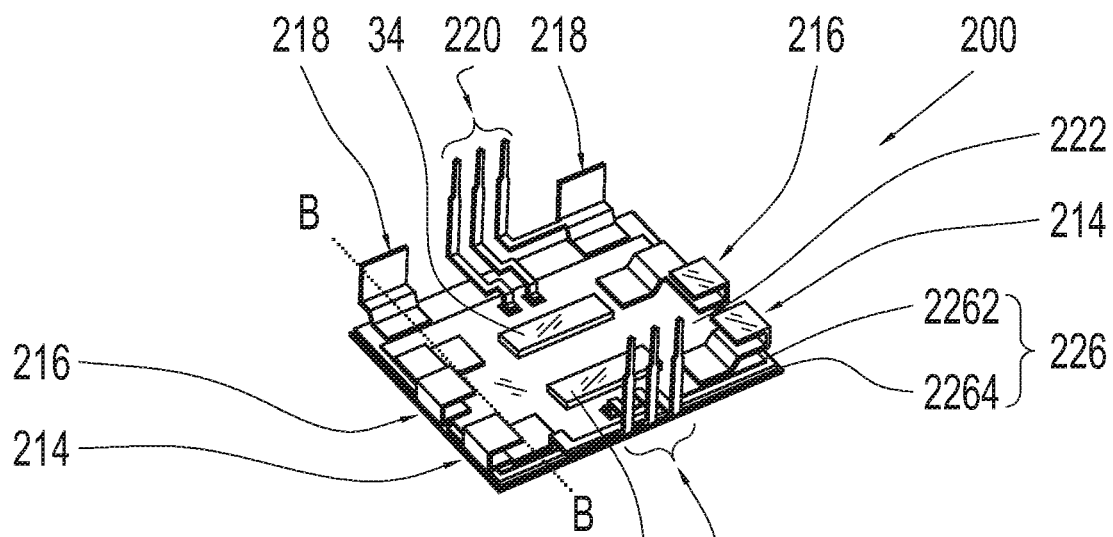
FIG. 9 shows an exemplary and schematic half-bridge according to another embodiment, wherein the casting compound is not shown for the purpose of the illustration.
Figure 10:
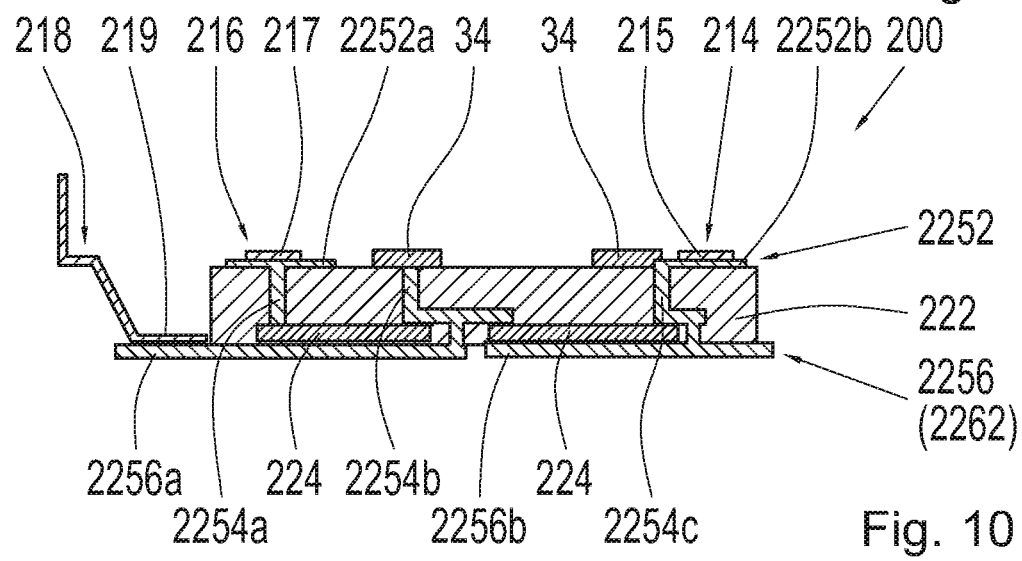
FIG. 10 shows the half-bridge in FIG. 9 in a side view.
Figure 11:
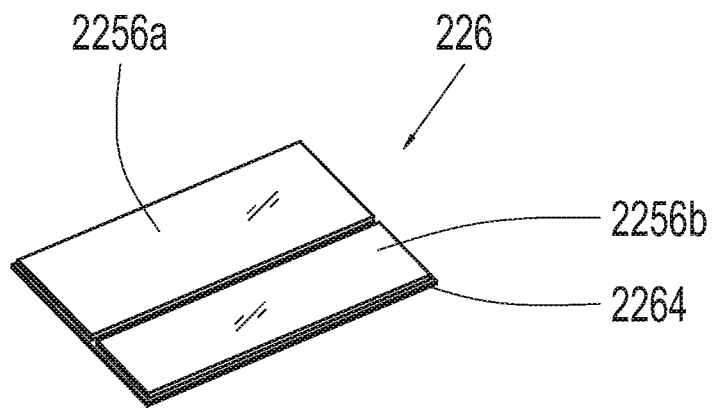
FIG. 11 shows the substrate in the half-bridge from FIG. 9, in a perspective view.

FIGS. 9-11 show a second specific embodiment of the half-bridge 200. Analogous to the first specific embodiment shown in FIGS. 6-8, the half-bridge 200 comprises a substrate 226, numerous embedded semiconductor switch elements 224, numerous power connections 214, 216, 218, and numerous signal connections 220. Analogous to the substrate 126, the substrate 226 comprises a first metal layer 2262, a second metal layer, and an insulating layer 2264, which is located between the first metal layer 2262 and the second metal layer. The semiconductor switch elements 224 are also embedded herein in a modular layer system, comprising a contact plane 222 and a metal plating. The contact plane 22 is on the upper surface of the substrate 226. As is shown in greater detail in the cutaway view in FIG. 10 along a cutting line B-B in FIG. 9, the metal plating comprises a first metal layer 2252, second metal layer 2256, and numerous vertical contacts 2254a-b, analogous to the embodiment shown in FIGS. 6-8. The contact plane 222, along with the first metal layer 2252 and the vertical contacts 2254a-b, forms a printed circuit board. The second metal layer 2256 is formed by the first metal layer 2262. As the perspective view in FIG. 11 shows, the first metal layer 2262 comprises to pre-structured regions, through which the second metal layer 2256 is formed. These different regions are spatially separated from one another, to ensure an electrical insulation between them. The vertical contacts 2254a-c are firs prefabricated inside the contact plane 222, before the semiconductor switch elements 224 are embedded in the contact plane 222. The embedding of the semiconductor switch elements 224 can take place in two ways, in a manner analogous to that for the embodiment shown in FIGS. 6-8.

As is shown in greater detail in the cutaway view in FIG. 10, the first metal layer 2252 comprises two islands 2252a, 2252b, which lie within the contact plane 222 and are electrically insulated from one another. The second power connection 216 is electrically connected to the first island 2252a via a (second) internal connection contact 217. The first power connection 214 is electrically connected to the second island 2252b via a (first) internal connection contact 215.

In addition, the first island 2252a is electrically connected to a first vertical contact 2254a, which extends vertically inside the contact plane 222 to the first metal layer 1252a-b. A second vertical contact 2254b extends vertically from a first edge 2256a of the second metal layer 2256 to the upper surface of the contact plane 222. The second vertical contact 2254b has a vertical section in the contact plane 222, which transitions into another vertical section via a horizontal section, and is electrically connected to the first driver component 34. An electrical connection between the first edge 2256b of the second metal layer 2256 and the first driver component 34 is obtained in this manner. The second edge 2256a is in direct electrical and thermal contact with the first semiconductor switch element 224.

The second island 2252b is electrically connected to a third vertical contact 2254c that extends from a second edge 2256b of the second metal layer 2256 to the first metal layer 2252. The second edge 2256b is in direct electrical and thermal contact with a second semiconductor switch element 224. The third vertical contact 2254c in this embodiment is formed analogously to the embodiment shown in FIGS. 6-8.

The first edge 2256a has an edge section that extends horizontally over the contour of the contact plane 222. The third power connection 218 is electrically connected to the first edge 2256a of the second metal layer 2256 via a third internal connection contact 219. The first semiconductor switch element 224 is embedded in the contact plane 222 between the horizontal section of the second vertical contact 2254b and the first edge 2256a of the second metal layer 2256. The second semiconductor switch element 224 is embedded in the contact plane 222 between the horizontal sections of the second and third vertical contacts 2254b-c and the second edge 2256b of the second metal layer 2256.

As shown schematically in FIG. 9, the first power connections 214 are each electrically connected to a second island in the first metal layer 2252. The second power connections 116 are each connected to a first edge of the first metal layer 2252. The third power connections 218 are electrically connected to the first edge of the second metal layer 2256 via the internal connection contact. The signal connections 220 are each electrically connected to another island in the first metal layer 2252 via an internal connection contact.

The specific embodiments shown in FIGS. 6-8 and 9-11 are exemplary and do not limit the subject matter of the invention. In particular, numerous horizontal sections can be formed in the vertical contacts that are vertically spaced apart from one another.

REFERENCE SYMBOLS

10, 10', 10a-c, 10aa-cb, 100, 200 half-bridges
12 casting compound
121 upper surface
13 heatsink
132 pin-fin structure
134 sintering layer
14, 114, 214 first power connection
142 first external connection contact
115, 215 first internal connection contact
16, 116, 216 second power connection
162 second external connection contact
216 second internal connection contact
18, 118, 218 third power connection
182 third external connection contact
119, 219 third internal connection contact
20 signal connection
202 external connection contact for the signal connection
22, 122, 222 contact plane
24, 124, 224 semiconductor switch elements
1252a-b, 2252a-b first metal layer
1254a-c, 2254a-c vertical contact
1256a-c, 2256a-b second metal layer
26 substrate
262, 1262, 2262 upper metal layer
264, 1264, 2264 insulating layer
266 lower metal layer
28 first busbar
30 second busbar
32, 32a-c third busbar
34 driver component
40, 50 power module

The invention claimed is:

1. A method for producing a half-bridge for an electric drive, the method comprising:
providing a substrate, semiconductor switch elements, power connections, and signal connections;
forming the power connections and signal connections in a flat conductor frame;
electrically connecting the signal connections to the semiconductor switch elements such that the semiconductor switch elements can be switched via the signal connections;
electrically connecting the power connections to the semiconductor switch elements such that the semiconductor switch elements allow or interrupt transfer of electricity between the power connections;
embedding the semiconductor switch elements in a modular layer system that comprises a contact plane and a metal plating for establishing contact with the semiconductor switch elements,
wherein the signal connections and power connections are located on a first surface of the substrate,
casting the modular layer system, signal connections and power connections in a casting compound,
wherein external sections of at least one of the power connections or signal connections formed in the conductor frame each extend from the casting compound from a second surface that is orthogonal to the first surface,
wherein the external sections each have an end that is perpendicular to the first surface, and
wherein the metal plating contains a first metal layer that faces away from the substrate and a second metal layer that faces toward the substrate, wherein the semiconductor switch elements are located between the first metal layer and the second metal layer, such that the semiconductor switch elements are electrically connected to the first metal layer, wherein the second metal layer is formed from a metal layer of the substrate facing the layer system, and
the method further comprising embedding the semiconductor switch elements in a printed circuit board comprising at least the first metal layer and the contact plane before the contact plane is connected to the metal layer of the substrate facing the layer system.

2. The method according to claim 1, further comprising: pre-fabricating one or more vertical contacts formed between the first metal layer and the second metal layer in the contact plane of the metal plating before the semiconductor switch elements are embedded in the printed circuit board.

3. The method according to claim 2, wherein one or more edges of the second metal layer extend parallel to the first surface over an edge of the printed circuit board, the method further comprising electrically connecting at least one of the power connections or signal connections to the edge.

4. The method according to claim 2, forming one or more islands in the contact plane on the first surface, wherein at least one of the power connections, signal connections, or at least one gate driver component are electrically connected to the island.

5. The method according to claim 1, further comprising connecting the semiconductor switch elements to the metal layer of the substrate facing the layer system before the contact plane is connected to the metal layer of the substrate, such that the semiconductor switch elements are embedded in the contact plane.

6. A half-bridge for an electric drive comprising:
a substrate;
semiconductor switch elements;
power connections; and
signal connections,
wherein the power connections and signal connections are formed in a flat conductor frame,
wherein the signal connections are electrically connected to the semiconductor switch elements such that the semiconductor switch elements can be switched via the signal connections, and
wherein the power connections are electrically connected to the semiconductor switch elements such that the semiconductor switch elements allow or interrupt transfer of electricity between the power connections,
wherein the semiconductor switch elements are embedded in a modular layer system that comprises a contact plane and a metal plating for establishing contact with the semiconductor switch elements,
wherein the signal connections and power connections are located on a first surface of the substrate,
wherein the modular layer system, signal connections and power connections are cast in a casting compound, wherein external sections of at least one of the power connections or signal connections formed in the conductor frame each extend from the casting compound from a second surface that is orthogonal to the first surface, wherein the external sections each have an end that is perpendicular to the first surface, wherein the metal plating contains a first metal layer that faces away from the substrate and a second metal layer that faces toward the substrate, wherein the semiconductor switch elements are located between the first metal layer and the second metal layer, such that the semiconductor switch elements are electrically connected to the first metal layer, wherein the second metal layer is formed from a metal layer of the substrate facing the layer system, and wherein the semiconductor switch elements are embedded in a printed circuit board comprising at least the first metal layer and the contact plane.

7. A power module for an inverter, comprising at least three half-bridges according to claim 6.

8. An inverter for an electric drive in an electric vehicle or hybrid vehicle, comprising a power module according to claim 7.

9. The half-bridge according to claim 6, wherein the metal plating comprises one or more vertical contacts formed between the first metal layer and the second metal layer.

10. The half-bridge according to claim 9, wherein one or more edges of the second metal layer extend parallel to the first surface over an edge of the printed circuit board, wherein at least one of the power connections or signal connections is electrically connected to the edge.

11. The half-bridge according to claim 9, wherein the first metal layer has one or more islands in the contact plane on the first surface, wherein at least one of the power connections, signal connections, or at least one gate driver component are electrically connected to the island.

12. The half-bridge according to claim 6, wherein the semiconductor switch elements are connected to the metal layer of the substrate facing the layer system and are embedded in the contact plane.

13. A half-bridge for an electric drive comprising:
a substrate;
semiconductor switch elements;
power connections; and
signal connections,
wherein the power connections and signal connections are formed in a flat conductor frame,
wherein the signal connections are electrically connected to the semiconductor switch elements such that the semiconductor switch elements can be switched via the signal connections, and
wherein the power connections are electrically connected to the semiconductor switch elements such that the semiconductor switch elements allow or interrupt transfer of electricity between the power connections,
wherein the semiconductor switch elements are embedded in a modular layer system that comprises a contact plane and a metal plating for establishing contact with the semiconductor switch elements,
wherein the signal connections and power connections are located on a first surface of the substrate,
wherein the modular layer system, signal connections and power connections are cast in a casting compound,
wherein external sections of at least one of the power connections or signal connections formed in the conductor frame each extend from the casting compound from a second surface that is orthogonal to the first surface, wherein the external sections each have an end that is perpendicular to the first surface,
wherein the metal plating contains a first metal layer that faces away from the substrate and a second metal layer that faces toward the substrate,
wherein the semiconductor switch elements are located between the first metal layer and the second metal layer, such that the semiconductor switch elements are electrically connected to the first metal layer,
wherein the second metal layer is formed from a metal layer of the substrate facing the layer system, and
wherein the semiconductor switch elements are connected to the metal layer of the substrate facing the layer system and are embedded in the contact plane.

14. The half-bridge according to claim 13, wherein the metal plating comprises one or more vertical contacts formed between the first metal layer and the second metal layer.

15. The half-bridge according to claim 14, wherein one or more edges of the second metal layer extend parallel to the first surface over an edge of a printed circuit board comprising at least the first metal layer and the contact plane, wherein at least one of the power connections or signal connections is electrically connected to the edge.

16. The half-bridge according to claim 14, wherein the first metal layer has one or more islands in the contact plane on the first surface, wherein at least one of the power connections, signal connections, or at least one gate driver component are electrically connected to the island.

* * * * *